(12) United States Patent
Ershov et al.

(10) Patent No.: US 9,066,412 B2
(45) Date of Patent: Jun. 23, 2015

(54) SYSTEMS AND METHODS FOR COOLING AN OPTIC

(75) Inventors: Alexander I. Ershov, Escondido, CA (US); Robert L. Morse, Vista, CA (US); William N. Partlo, Poway, CA (US); Christopher P. Pate, San Diego, CA (US)

(73) Assignee: ASML Netherlands B.V., Veldhoven (NL)

( * ) Notice: Subject to any disclaimer, the term of this patent is extended or adjusted under 35 U.S.C. 154(b) by 1003 days.

(21) Appl. No.: 12/900,762

(22) Filed: Oct. 8, 2010

(65) Prior Publication Data

US 2011/0253349 A1    Oct. 20, 2011

Related U.S. Application Data

(60) Provisional application No. 61/324,702, filed on Apr. 15, 2010.

(51) Int. Cl.
| | | |
|---|---|---|
| *G02B 7/02* | (2006.01) | |
| *G02B 3/12* | (2006.01) | |
| *G02B 1/06* | (2006.01) | |
| *H05G 2/00* | (2006.01) | |
| *G02B 7/00* | (2006.01) | |
| *G03F 7/20* | (2006.01) | |

(52) U.S. Cl.
CPC ............ *H05G 2/008* (2013.01); *G02B 7/008* (2013.01); *G03F 7/70033* (2013.01); *G03F 7/70891* (2013.01)

(58) Field of Classification Search
CPC .. G02B 7/008; G03F 7/70033; G03F 7/70891

USPC ......... 359/754, 664–667, 819–820, 811, 815, 359/822–824, 694, 698, 383, 384, 395, 410
See application file for complete search history.

(56) References Cited

U.S. PATENT DOCUMENTS

| | | | |
|---|---|---|---|
| 5,349,831 A * | 9/1994 | Daikoku et al. | 62/376 |
| 5,359,620 A | 10/1994 | Akins | |
| 5,885,358 A | 3/1999 | Mayden et al. | |
| 6,661,018 B1 | 12/2003 | McGregor et al. | |
| 6,781,668 B2 * | 8/2004 | Schuster et al. | 355/30 |
| 7,087,914 B2 | 8/2006 | Akins et al. | |
| 7,164,144 B2 | 1/2007 | Partlo et al. | |
| 7,372,056 B2 | 5/2008 | Bykanov et al. | |
| 7,405,416 B2 | 7/2008 | Algots et al. | |

(Continued)

FOREIGN PATENT DOCUMENTS

WO       2008153468       12/2009

OTHER PUBLICATIONS

Blaine R. Copenheaver, officer of the International Searching Authority, issued International Search Report in related application PCT/US2011/032187; dated Jul. 5, 2011, 2 pages.

(Continued)

*Primary Examiner* — Stephone B Allen
*Assistant Examiner* — Brandi Thomas

(57) ABSTRACT

Devices are described herein which may comprise an optic having a non-planar surface, the non-planar surface having an optically active portion; and a flow guide directing gas upon the non-planar surface to produce turbulent flow on at least a portion of the optically active portion of the non-planar surface to cool the optic.

19 Claims, 3 Drawing Sheets

(56) References Cited

U.S. PATENT DOCUMENTS

| | | |
|---|---|---|
| 7,439,530 B2 | 10/2008 | Ershov et al. |
| 7,465,946 B2 | 12/2008 | Bowering et al. |
| 7,491,954 B2 | 2/2009 | Bykanov et al. |
| 2001/0006412 A1 | 7/2001 | Karl-Heinz et al. |
| 2002/0017514 A1 | 2/2002 | Lambert |
| 2003/0053594 A1 | 3/2003 | Fornaciari et al. |
| 2004/0050112 A1* | 3/2004 | Bae et al. .................. 65/424 |
| 2006/0001952 A1 | 1/2006 | Janka et al. |
| 2006/0255298 A1 | 11/2006 | Bykanov et al. |
| 2007/0285344 A1 | 12/2007 | Plut |
| 2008/0043321 A1 | 2/2008 | Bowering et al. |
| 2009/0014668 A1 | 1/2009 | Vaschenko |
| 2009/0230326 A1 | 9/2009 | Vaschenko et al. |
| 2010/0097579 A1* | 4/2010 | Hsieh et al. ................. 353/52 |

OTHER PUBLICATIONS

Blaine R. Copenheaver, officer of the International Searching Authority, issued Written Opinion in related application PCT/US2011/032187; dated Jul. 5, 2011, 7 pages.

U.S. Appl. No. 12/638,092, filed Dec. 15, 2009; Inventors: Robert A. Bergstedt, et al.; entitled "Beam Transport System for Extreme Ultraviolet Light Source"—31 pages of specification. claims, abstract and 11 pages of drawings (42 pages total).

\* cited by examiner

SYSTEMS AND METHODS FOR COOLING AN OPTIC

FIELD

The present disclosure relates to extreme ultraviolet ("EUV") light sources that provide EUV light from a plasma that is created from a target material and collected and directed to an intermediate region for utilization outside of the EUV light source chamber, e.g., by a lithography scanner/stepper.

BACKGROUND

Extreme ultraviolet ("EUV") light, e.g., electromagnetic radiation having wavelengths of around 50 nm or less (also sometimes referred to as soft x-rays), and including light at a wavelength of about 13.5 nm, can be used in photolithography processes to produce extremely small features in substrates, e.g., silicon wafers.

Methods to produce EUV light include, but are not necessarily limited to, converting a material into a plasma state that has an element, e.g., xenon, lithium or tin, with an emission line in the EUV range. In one such method, often termed laser produced plasma ("LPP") the required plasma can be produced by irradiating a target material, such as a droplet, stream or cluster of material having the required line-emitting element, with a laser beam.

For this process, the plasma is typically produced in a sealed vessel, e.g., vacuum chamber, and monitored using various types of metrology equipment. In addition to generating EUV radiation, these plasma processes also typically generate undesirable by-products in the plasma chamber which can include heat, high energy ions and scattered debris from the plasma formation, e.g., atoms and/or clumps/microdroplets of source material that is not fully ionized in the plasma formation process.

These plasma formation by-products can potentially damage or reduce the operational efficiency of the various plasma chamber optical elements including, but not limited to, collector mirrors including multi-layer mirrors (MLM's) capable of EUV reflection at normal incidence and/or grazing incidence, the surfaces of metrology detectors, windows used to image the plasma formation process, and the laser input window. The heat, high energy ions and/or source material debris may be damaging to the optical elements in a number of ways, including heating them, coating them with materials which reduce light transmission or interact with light to produce undesirable heat, penetrating into them and, e.g., damaging structural integrity and/or optical properties, e.g., the ability of a mirror to reflect light at such short wavelengths, corroding or eroding them and/or diffusing into them.

For an LPP system, optics such as the laser beam focusing lens and/or laser beam input window may experience undesirable heat loading due to exposure to the high fluence, e.g. 150-325 W/cm$^2$ from the relatively high powered drive laser, which may be, for example, a pulsed, focused 10-12 kW $CO_2$ drive laser which is synchronized with a droplet generator to sequentially irradiate about 10,000-200,000 tin droplets per second.

In some cases, the laser focusing lens may also function as a laser input window, forming a part of the vacuum chamber, and may be placed under considerable stress due to a pressure differential between the relatively high vacuum in the plasma chamber and the pressure, e.g. atmospheric pressure, outside the plasma chamber. For these windows, deposits and heat can combine to fracture (i.e., crack) the element resulting in a loss of vacuum and requiring a costly repair. To accommodate this stress and prevent fracture, laser input windows have generally been rather thick, and, as a consequence, are subject to thermal lensing. This thermal lensing, in turn, can reduce the ability to properly steer and focus a laser beam to a desired location within the plasma chamber. For example, for use in some LPP EUV light sources, it is contemplated that a lens or mirror be used to accurately focus a high power laser beam to a focal spot sized to irradiate droplets having a diameter between about 10-100 μm.

With the above in mind, Applicants disclose systems and methods for cooling an optic.

SUMMARY

In a first aspect, a device is described herein which may comprise an optic having a non-planar surface, the non-planar surface having an optically active portion; and a flow guide directing gas upon the non-planar surface to produce turbulent flow on at least a portion of the optically active portion of the non-planar surface to cool the optic.

In one embodiment, turbulent flow may be produced on at least seventy-five percent of the optically active portion of the non-planar surface.

In a particular embodiment, the flow guide may comprise a ring having a plurality of nozzles, each nozzle directing gas toward the optic. In some arrangements, each nozzle may be a diverging nozzle and in one implementation, the flow guide may have at least six uniformly spaced nozzles. In a particular arrangement, the ring may be formed with a single gas flow inlet and an internal passageway connecting the inlet to each nozzle.

In a particular implementation, the nozzles may be positioned and arranged to flow gas along a spiral path from a peripheral region of the optically active portion to a central region of the optically active portion.

In one embodiment, the flow guide may be made of a thermally conductive material and a thermally conductive spacer may be positioned between the optic and ring to conduct heat from the optic to the ring.

In one setup, the optic may be a lens and the optically active surface portion may be convex.

In one arrangement, a first nozzle may produce an output jet oriented to disturb an output jet from a second nozzle, and in a particular arrangement, a first nozzle may produce an output jet oriented to disturb an output jet from a second nozzle at a peripheral region of an optically active portion of the optic.

In another aspect, a device is described herein which may comprise an optic; a laser irradiating the optic; and a flow guide having a plurality of nozzles arranged to direct gas on the optic during irradiation of the optic to produce turbulent flow on at least a portion of the optic.

In one embodiment of this aspect, the flow guide may comprise a ring.

In one arrangement of this aspect, each nozzle may be a diverging nozzle.

In a particular embodiment, the flow guide may have at least six uniformly spaced nozzles.

In one embodiment, the nozzles may be positioned and arranged to flow gas along a spiral path from a peripheral region of an optically active portion of the optic to a central region of the optically active portion.

In a particular arrangement, a first nozzle may produce an output jet oriented to disturb an output jet from a second nozzle at a peripheral region of an optically active portion of the optic.

In another aspect, a device is described herein which may comprise the steps of: providing an optic; irradiating the optic with a laser beam; and directing a plurality of gas jets on the optic during the irradiating step to produce turbulent flow on at least a portion of the optic.

In one implementation of the method, the optic may be a lens.

In a particular implementation, the method may include the steps of: producing a first output jet at a peripheral region of an optically active portion of the optic; and producing a first output jet oriented to disturb the first output jet.

DETAILED DESCRIPTION

Figure 1:
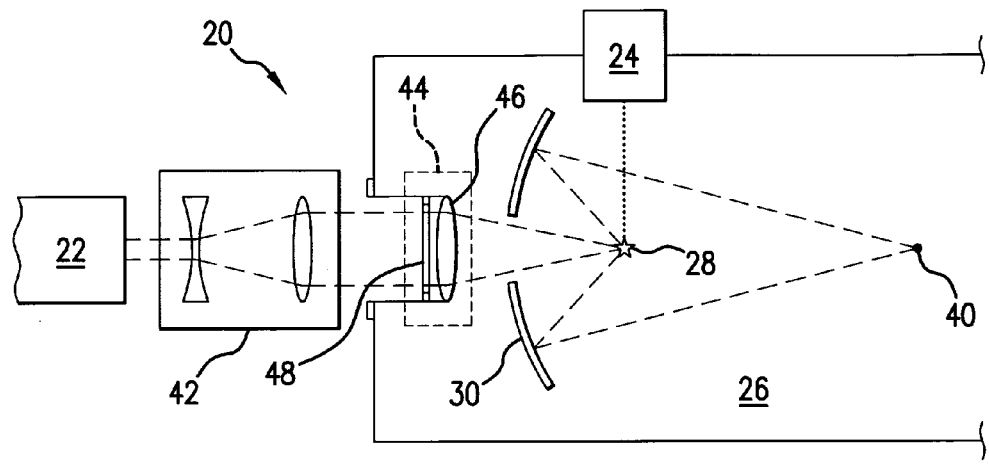
FIG. 1 shows a simplified, schematic view of an embodiment of an EUV light source.

With initial reference to FIG. 1, there is shown a simplified, schematic view of an embodiment of an EUV light source, e.g., a laser-produced-plasma EUV light source 20, As shown in FIG. 1, the LPP light source 20 may include a system 22 for generating a train of light pulses and delivering the light pulses into a chamber 26. For the source 20, each light pulse may travel along a beam path from the system 22 and into the chamber 26 to illuminate a respective target droplet at an irradiation region 28.

Suitable lasers for use in the system 22 shown in FIG. 1, may include a pulsed laser device, e.g., a pulsed gas discharge $CO_2$ laser device producing radiation at 9.3 µm or 10.6 µm, e.g., with DC or RF excitation, operating at relatively high power, e.g., 10 kW or higher and high pulse repetition rate, e.g., 50 kHz or more. In one particular implementation, the laser may be an axial-flow RF-pumped $CO_2$ laser having an oscillator-amplifier configuration (e.g. master oscillator/power amplifier (MOPA) or power oscillator/power amplifier (POPA)) with multiple stages of amplification and having a seed pulse that is initiated by a Q-switched oscillator with relatively low energy and high repetition rate, e.g., capable of 100 kHz operation. From the oscillator, the laser pulse may then be amplified, shaped and/or focused before reaching the irradiation region 28. Continuously pumped $CO_2$ amplifiers may be used for the system 22. For example, a suitable $CO_2$ laser device having an oscillator and three amplifiers (O-PA1-PA2-PA3 configuration) is disclosed in U.S. patent application Ser. No. 11/174,299 filed on Jun. 29, 2005, entitled, LPP EUV LIGHT SOURCE DRIVE LASER SYSTEM, now U.S. Pat. No. 7,439,530, issued on Oct. 21, 2008, the entire contents of which are hereby incorporated by reference herein. Alternatively, the laser may be configured as a so-called "self-targeting" laser system in which the droplet serves as one mirror of the optical cavity. In some "self-targeting" arrangements, an oscillator may not be required. Self-targeting laser systems are disclosed and claimed in U.S. patent application Ser. No. 11/580,414 filed on Oct. 13, 2006, entitled, DRIVE LASER DELIVERY SYSTEMS FOR EUV LIGHT SOURCE, now U.S. Pat. No. 7,491,954, issued on Feb. 17, 2009, the entire contents of which are hereby incorporated by reference herein.

Depending on the application, other types of lasers may also be suitable, e.g., an excimer or molecular fluorine laser operating at high power and high pulse repetition rate. Other examples include, a solid state laser, e.g., having a fiber, rod, slab or disk-shaped active media, other laser architectures having one or more chambers, e.g., an oscillator chamber and one or more amplifying chambers (with the amplifying chambers in parallel or in series), a master oscillator/power oscillator (MOPO) arrangement, a master oscillator/power ring amplifier (MOPRA) arrangement, or a solid state laser that seeds one or more excimer, molecular fluorine or $CO_2$ amplifier or oscillator chambers, may be suitable. Other designs may be suitable.

As further shown in FIG. 1, the EUV light source 20 may also include a target material delivery system 24, e.g., delivering droplets of a target material into the interior of a chamber 26 to the irradiation region 28, where the droplets will interact with one or more light pulses, e.g., zero, one or more pre-pulses and thereafter one or more main pulses, to ultimately produce plasma and generate an EUV emission. More details regarding various droplet dispenser configurations and their relative advantages may be found in U.S. Ser. No. 12/214,736, filed on Jun. 19, 2008, entitled SYSTEMS AND METHODS FOR TARGET MATERIAL DELIVERY IN A LASER PRODUCED PLASMA EUV LIGHT SOURCE, U.S. patent application Ser. No. 11/827,803, filed on Jul. 13, 2007, entitled LASER PRODUCED PLASMA EUV LIGHT SOURCE HAVING A DROPLET STREAM PRODUCED USING A MODULATED DISTURBANCE WAVE, U.S. patent application Ser. No. 11/358,988, filed on Feb. 21, 2006, entitled LASER PRODUCED PLASMA EUV LIGHT SOURCE WITH PRE-PULSE, and published on Nov. 16, 2006 as US2006/0255298A-1; U.S. patent application Ser. No. 11/067,124, filed on Feb. 25, 2005, entitled METHOD AND APPARATUS FOR EUV PLASMA SOURCE TARGET DELIVERY, issued on Jul. 29, 2008; and U.S. patent application Ser. No. 11/174,443, filed on Jun. 29, 2005, entitled LPP EUV PLASMA SOURCE MATERIAL TARGET DELIVERY SYSTEM, now U.S. Pat. No. 7,372,056, issued on May 13, 2008; the contents of each of which are hereby incorporated by reference.

The target material may include, but is not necessarily limited to, a material that includes tin, lithium, xenon or combinations thereof. The EUV emitting element, e.g., tin, lithium, xenon, etc., may be in the form of liquid droplets and/or solid particles contained within liquid droplets. For example, the element tin may be used as pure tin, as a tin compound, e.g., $SnBr_4$, $SnBr_2$, $SnH_4$, as a tin alloy, e.g., tin-gallium alloys, tin-indium alloys, tin-indium-gallium alloys, or a combination thereof. Depending on the material used, the target material may be presented to the irradiation region 28 at various temperatures including room temperature or near room temperature (e.g., tin alloys, $SnBr_4$), at an elevated temperature, (e.g., pure tin) or at temperatures below room temperature, (e.g., $SnH_4$), and in some cases, can be relatively volatile, e.g., $SnBr_4$. More details concerning the use of these materials in an LPP EUV light source is provided in U.S. patent application Ser. No. 11/406,216, filed on Apr. 17, 2006, entitled ALTERNATIVE FUELS FOR EUV LIGHT SOURCE, now U.S. Pat. No. 7,465,946, issued on Dec. 16, 2008, the contents of which are hereby incorporated by reference herein.

Continuing with FIG. 1, the EUV light source 20 may also include an optic 30, e.g., a near-normal incidence collector mirror having a reflective surface in the form of a prolate spheroid (i.e., an ellipse rotated about its major axis) having, e.g., a graded multi-layer coating with alternating layers of Molybdenum and Silicon, and in some cases, one or more high temperature diffusion barrier layers, smoothing layers, capping layers and/or etch stop layers. FIG. 1 shows that the optic 30 may be formed with an aperture to allow the light pulses generated by the system 22 to pass through and reach the irradiation region 28. As shown, the optic 30 may be, e.g., a prolate spheroid minor that has a first focus within or near the irradiation region 28 and a second focus at a so-called intermediate region 40, where the EUV light may be output from the EUV light source 20 and input to a device utilizing EUV light, e.g., an integrated circuit lithography tool (not shown). It is to be appreciated that other optics may be used in place of the prolate spheroid mirror for collecting and directing light to an intermediate location for subsequent delivery to a device utilizing EUV light, for example, the optic may be a parabola rotated about its major axis or may be configured to deliver a beam having a ring-shaped cross-section to an intermediate location, see e.g., U.S. patent application Ser. No. 11/505,177, filed on Aug. 16, 2006, published on Feb. 21, 2008, as U.S. 2008/0043321A1, entitled EUV OPTICS, the contents of which are hereby incorporated by reference.

FIG. 1 also shows that the source 20 may include a beam conditioning unit 42 having one or more optics for expanding, steering, pulse shaping and/or shaping the beam between the system 22 and a focusing unit 44. Further details regarding beam conditioning are provided in, see e.g., U.S. patent application Ser. No. 10/803,526, filed on Mar. 17, 2004, entitled A HIGH REPETITION RATE LASER PRODUCED PLASMA EUV LIGHT SOURCE, now U.S. Pat. No. 7,087,914, issued on Aug. 8, 2006; and/or U.S. Ser. No. 10/900,839 filed on Jul. 27, 2004, entitled EUV LIGHT SOURCE, now U.S. Pat. No. 7,164,144, issued on Jan. 16, 2007, and U.S. patent application Ser. No. 12/638,092, filed on Dec. 15, 2009, entitled BEAM TRANSPORT SYSTEM FOR EXTREME ULTRAVIOLET LIGHT SOURCE, the contents of each of which are hereby incorporated by reference.

For the source 22, the focusing unit 44 may include one or more optics for focusing a beam to a focal spot at the irradiation site.

As used herein, the term "optic" and its derivatives includes, but is not necessarily limited to, one or more components which reflect and/or transmit and/or operate on incident light and includes, but is not limited to, one or more lenses, windows, filters, wedges, prisms, grisms, gradings, transmission fibers, etalons, diffusers, homogenizers, detectors and other instrument components, input apertures, axicons and mirrors including multi-layer mirrors, near-normal incidence mirrors, grazing incidence mirrors, specular reflectors, diffuse reflectors and combinations thereof. Moreover, unless otherwise specified, neither the term "optic" nor its derivatives, as used herein, are meant to be limited to components which operate solely or to advantage within one or more specific wavelength range(s) such as at the EUV output light wavelength, the irradiation laser wavelength, a wavelength suitable for metrology or some other wavelength.

As further shown in FIG. 1, a suitable focusing arrangement of unit 44 may include a convex lens 46 and a system 48 for cooling the lens 46. As shown, for this arrangement, the lens 46 serves to focus the beam to a focal spot at the irradiation region 28 and as a laser input window for the chamber 26. The system 48 may also advantageously cool structural components around the lens, e.g. housings, mounting hardware, etc., for example, by turbulent forced convection.

Figure 2:
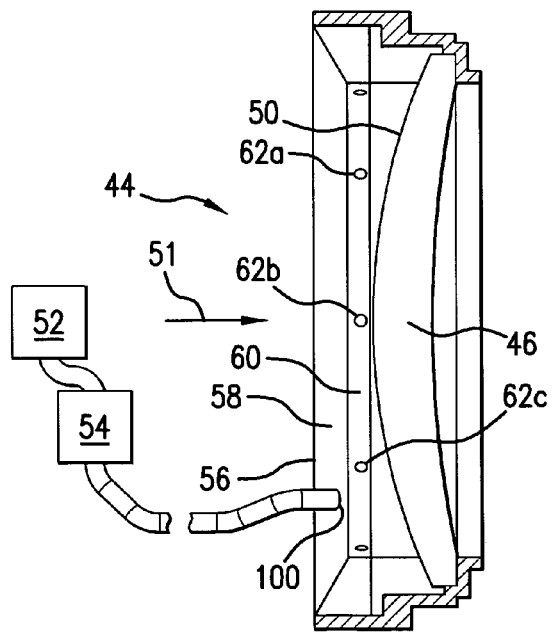
FIG. 2 shows a cross-section through an example of a focusing unit.

FIG. 2 is a cross-section through an example of a focusing unit 44. As shown, the focusing unit 44 may include an optic, which for the setup shown may be a 177 mm lens 46 made of optical grade ZnSe and having an optically active portion on the cooled surface, e.g. clear aperture 150, of about 135 mm. As further shown, the lens 46 may be formed with a non-planar surface 50, which for the lens 46 shown, is convex. With this arrangement, a beam having a diameter of about 120 mm and travelling in the direction of arrow 51 can be comfortably focused.

Figure 3:
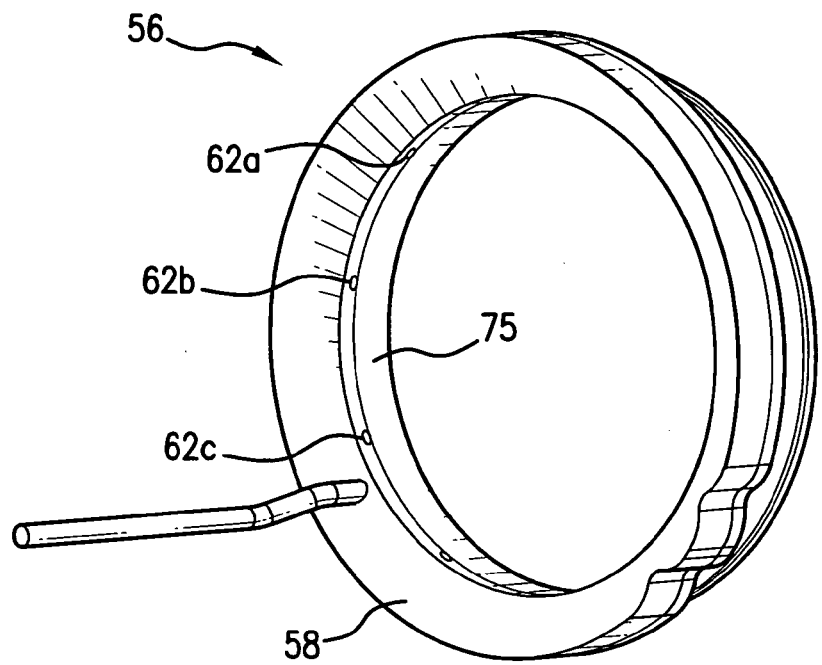
FIG. 3 shows a perspective view of an example of a flow guide.

As best seen with cross-reference to FIG. 2 and FIG. 3, the focusing unit 44 may also include a system 48 for cooling the lens 46 having a gas source 52, mass flow controller 54 and flow guide 56. For this arrangement, the gas source may be a compressed gas cylinder containing, for example, Nitrogen or Argon or another suitable gas or gas mixture.

For the system 48, flow guide 52 may be provided to direct a flow of gas onto the surface 50 to produce turbulent flow on a substantial portion of the optically active portion of the surface 50 to cool the optic 46. Having uniform cooling on the lens minimizes focal shift due to temperature gradients, thermal expansion and change of optical index. Moreover, heat transfer is maximized by inducing a turbulent region of moving gas at the surface of the lens.

In more detail, the flow guide 52 may be made of a conductive material, e.g., metal such as 6061 Aluminum, and may include a ring portion 58 having an annular, inside facing, surface 60 formed with a plurality of nozzles 62. A conductive spacer 75 may be provided (separate from or integral with the ring) to conduct heat from the optic 46 to the ring portion 58. For the arrangement shown, the flow guide 52 includes ten nozzles 62, however, it is to be appreciated that more than ten, and as few as one nozzle, may be used to produce turbulent flow on a substantial portion of the optically active portion of the surface 50.

Figure 4:
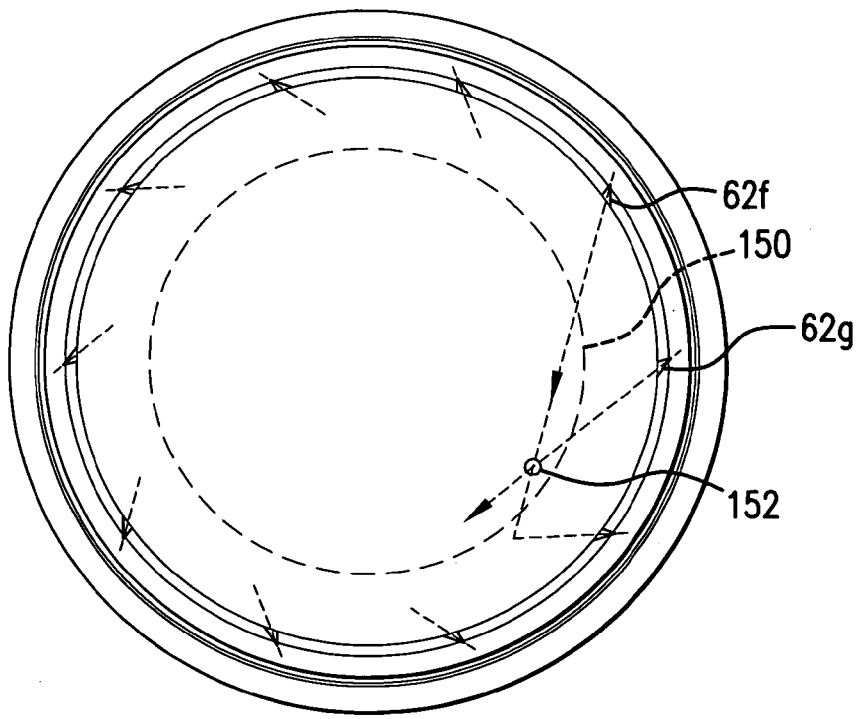
FIG. 4 shows a top view of an example of a flow guide.
Figure 5:
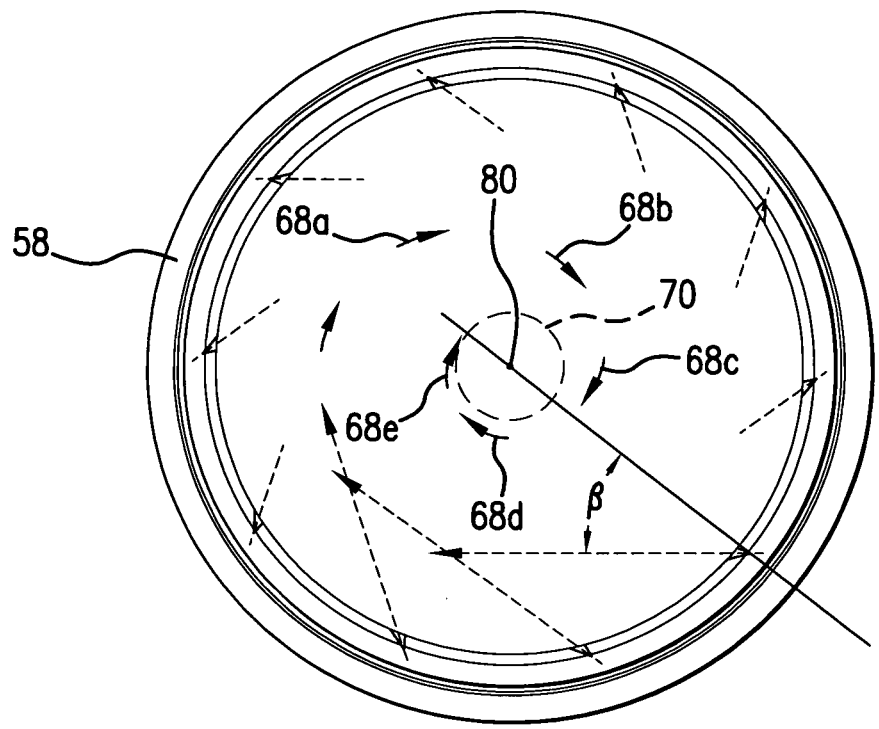
FIG. 5 shows a top view of an example of a flow guide and illustrates a spiral flow pattern.
Figure 6:
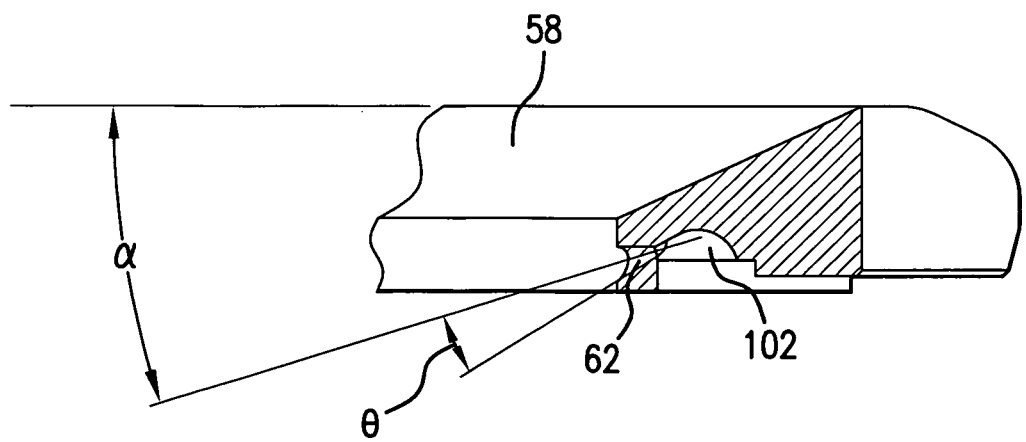
FIG. 6 shows a cross-section through an example of a flow guide.

FIG. 4 shows that the nozzles 62 may be uniformly spaced around the periphery of the ring 58. FIGS. 4 and 6 also illustrate that each nozzle 62 may be a diverging nozzle, increasing in effective diameter from nozzle entrance to nozzle exit. FIG. 6 shows the divergence half angle, $\theta$, which may be about 15 degrees, for the example flow guide shown, and also shows that each nozzle may expand from an initial diameter of about 1.0 mm to a final diameter of about 3.4 mm. In other arrangements, a divergence half angle, $\theta$, in the range of about 0-20 degrees may be suitable. FIGS. 4 and 5 also show that the nozzles 62 may be positioned and arranged to produce a gas flow wherein gas flows along a spiral path (as indicated by arrows 68a-e from a peripheral region of said optically active portion, to a central region 70 of said optically active portion. FIGS. 5 and 6 show a suitable orientation of a nozzle axis relative to the plane of the ring, $\alpha$, and the ring axis 80, $\beta$. For the arrangement shown, $\alpha$ is about 17 degrees and the $\beta$ is about 38 degrees. In other arrangements, an orientation of a nozzle axis relative to the plane of the ring, $\alpha$, may be in the range of 0-90 degrees and an orientation of a nozzle axis relative to the ring axis 80, $\beta$ may be in the range of 0-90 degrees.

It can further be seen that the ring 58 may be formed with a gas flow inlet 100 and an internal passageway 102, formed in the ring 58 that extends around the ring 58 connecting inlet 100 to each nozzle 62. For the ring 58, the passageway diameter may be sized larger, e.g. two times larger or more, than each nozzle's effective minimum diameter to ensure that each nozzle receives approximately the to same nozzle input gas pressure. With this arrangement, all nozzles may be adequately supplied with gas from a single input line with each nozzle producing a similar output jet.

With the arrangement that is described above, FIG. 4 shows that the output jet from nozzle 62f meets and disturbs the output jet from adjacent nozzle 62g at point 152 which is near the periphery of the clear aperture 150. More specifically, the jet from nozzle 62p meets the jet from adjacent nozzle 62g near the output of nozzle 62g, e.g., within ⅓, or in some cases, within ¼ of a lens/mirror diameter D from the periphery of the lens/mirror. Thus, with this arrangement, turbulent flow may be obtained near the periphery of the clear aperture 150. The interactions between the gas jets may advantageously cause an early transition to turbulent flow. The size, position, angle and spacing of the jets may be adjusted to enhance the transition to turbulent flow and may provide uniform cooling at the same time.

Note also, as shown in FIG. 5, the gas flows generally from the periphery to a center region in a generally spiral pattern, and this flow in the spiral pattern is also turbulent since it is downstream of the ten jet disturbance points 152 (of which only one is shown). In another arrangement (not shown) the nozzles may be arranged such that adjacent jet collisions are located either on or outside of the clear aperture of the lens or mirror.

In practice, the number, size and orientation of the nozzles may depend on the size and shape of the optic to be cooled and the heat load (e.g., fluence). Typically, a computation fluid dynamics (CFD) program such as Ansys CSX may be employed to verify and/or optimize a specific nozzle design.

Example

The setup described above was exposed to a 10.6 µm light at a fluence of about 177 W/cm$^2$ and 100% duty cycle for a 4 second burst length with a mass flow rate of Nitrogen of 20 liters/min entering the ring. During exposure, the lens was sufficiently cooled to substantially focus the beam at a focal spot without distortion as compared to the focusing of a single pulse.

While the particular embodiment(s) described and illustrated in this patent application in the detail required to satisfy 35 U.S.C. §112, are fully capable of attaining one or more of the above-described purposes for, problems to be solved by, or any other reasons for, or objects of the embodiment(s) described above, it is to be understood by those skilled in the art that the above-described embodiment(s) are merely exemplary, illustrative and representative of the subject matter which is broadly contemplated by the present application. Reference to an element in the following Claims in the singular, is not intended to mean, nor shall it mean in interpreting such Claim element "one and only one" unless explicitly so stated, but rather "one or more". All structural and functional equivalents to any of the elements of the above-described embodiment(s) that are known, or later come to be known to those of ordinary skill in the art, are expressly incorporated herein by reference and are intended to be encompassed by the present Claims. Any term used in the Specification and/or in the Claims, and expressly given a meaning in the Specification and/or Claims in the present Application, shall have that meaning, regardless of any dictionary or other commonly used meaning for such a term. It is not intended or necessary for a device or method discussed in the Specification as an embodiment, to address or solve each and every problem discussed in this Application, for it to be encompassed by the present Claims. No element, component, or method step in the present disclosure is intended to be dedicated to the public regardless of whether the element, component, or method step is explicitly recited in the Claims. No claim element in the appended Claims is to be construed under the provisions of 35 U.S.C. §112, sixth paragraph, unless the element is expressly recited using the phrase "means for" or, in the case of a method claim, the element is recited as a "step" instead of an "act".

What is claimed is:

1. A device comprising:
   an optic having a non-planar surface and an annular periphery, the nonplanar surface having an optically active portion, the optic representing a lens for focusing light passing through the nonplanar surface toward a focal spot; and
   a flow guide disposed concentrically surrounding and outside of said periphery, said flow guide having a plurality of nozzles disposed on an inward facing surface of said flow guide, said plurality of nozzles directing gas upon said non-planar surface to produce turbulent flow on at least a portion of the optically active portion of said non-planar surface to cool said optic.

2. A device as recited in claim 1 wherein turbulent flow is produced on at least seventy-five percent of said optically active portion of said non-planar surface.

3. A device as recited in claim 1 wherein each nozzle is a diverging nozzle.

4. A device as recited in claim 1 wherein said flow guide has at least six uniformly spaced nozzles.

5. A device as recited in claim 1 wherein the nozzles are positioned and arranged to flow gas along a spiral path from a peripheral region of said optically active portion to a central region of said optically active portion.

6. A device as recited in claim 1 wherein said flow guide is made of a thermally conductive material and wherein a thermally conductive spacer is positioned between said optic and ring to conduct heat from said optic to said ring.

7. A device as recited in claim 1 wherein said ring is formed with a single gas flow inlet and an internal passageway connecting said inlet to each nozzle.

8. A device as recited in claim 1 wherein said optically active surface portion is convex.

9. A device as recited in claim 1 wherein a first nozzle produces an output jet oriented to disturb an output jet from a second nozzle.

10. A device as recited in claim 1 wherein a first nozzle produces an output jet oriented to disturb an output jet from a second nozzle at a peripheral region of said optically active portion.

11. A device comprising:
    an optic having an annular periphery and a convex surface;
    a laser irradiating said optic by passing through the convex surface of the optic and focusing upon a focal spot of said optic; and
    a flow guide disposed concentrically surrounding and outside of said periphery, said flow guide having a plurality of nozzles disposed on an inward facing surface of said flow guide, said plurality of nozzles directing gas on said convex surface of said optic during irradiation of the optic to produce turbulent flow on at least a portion of the optic.

12. A device as recited in claim 11 wherein said flow guide comprises a ring.

13. A device as recited in claim 11 wherein each nozzle is a diverging nozzle.

14. A device as recited in claim 11 wherein said flow guide has at least six uniformly spaced nozzles.

15. A device as recited in claim 11 wherein the nozzles are positioned and arranged to flow gas along a spiral path from a peripheral region of an optically active portion of the optic to a central region of said optically active portion.

16. A device as recited in claim 11 wherein a first nozzle produces an output jet oriented to disturb an output jet from a second nozzle at a peripheral region of an optically active portion of the optic.

17. A method comprising the steps of:
   providing an optic having an annular periphery and a convex surface;
   disposing a flow guide concentrically surrounding and outside of said periphery, said flow guide having a plurality of nozzles disposed on an inward facing surface of said flow guide;
   irradiating said optic with a laser beam by passing through the convex surface of the optic and focusing upon a focal spot of said optic; and
   directing gas from said plurality of nozzles on said convex surface of said optic during said irradiating step to produce turbulent flow on at least a portion of the optic.

18. A method as recited in claim 17 wherein the optic is a lens.

19. A method as recited in claim 17 further comprising the steps of:
   producing a first output jet at a peripheral region of an optically active portion of the optic; and
   producing a second output jet oriented to disturb the first output jet.

* * * * *